United States Patent [19]

Sekikawa et al.

[11] Patent Number: 5,023,195
[45] Date of Patent: Jun. 11, 1991

[54] METHOD FOR MANUFACTURING A SEMICONDUCTOR INTEGRATED CIRCUIT INCLUDING A BIPOLAR TRANSISTOR

[75] Inventors: Nobuyuki Sekikawa; Tadayoshi Takada, both of Gunma, Japan

[73] Assignee: Sanyo Electric Co., Ltd., Osaka, Japan

[21] Appl. No.: 525,166

[22] Filed: May 16, 1990

[30] Foreign Application Priority Data

May 19, 1989 [JP] Japan .................. 1-127319

[51] Int. Cl.⁵ ............................ H01L 21/331
[52] U.S. Cl. ......................... 437/31; 437/27; 437/51; 437/150; 437/153; 437/978; 148/DIG. 106
[58] Field of Search ............ 437/31, 32, 33, 51, 437/59, 150, 153, 154, 978, 63, 27; 357/34; 148/DIG. 106

[56] References Cited

U.S. PATENT DOCUMENTS

| | | | |
|---|---|---|---|
| 4,009,057 | 2/1977 | de Brebisson et al. | 148/DIG. 106 |
| 4,573,257 | 3/1986 | Hulseweh | 148/DIG. 106 |
| 4,721,686 | 1/1988 | Contiero et al. | 437/31 |
| 4,902,633 | 2/1990 | Cambou | 437/31 |
| 4,910,160 | 3/1990 | Jennings et al. | 437/31 |

FOREIGN PATENT DOCUMENTS 0026580 3/1978 Japan .................. 437/53
2034519 6/1980 United Kingdom .......... 437/154

Primary Examiner—Brian E. Hearn
Assistant Examiner—T. N. Quach
Attorney, Agent, or Firm—Spensley Horn Jubas & Lubitz

[57] ABSTRACT

After a base region and a base contact region, a diffused resistance region and a pair of contact regions formed at each end of the diffused resistance region are formed, an silicon oxide film of essentially uniform thickness is formed anew on the surface of an epitaxial layer. In the silicon oxide film, a collector contact/doping window, a base contact window, an emitter contact/doping window, a lower layer electrode contact window, and a diffused resistance element contact window are formed simultaneously, then the base contact region and the diffused resistance element contact regions are shielded by a mask and a collector contact region, an emitter contact region, and a lower layer electrode contact region are doped. The method of manufacturing a semiconductor integrated circuit of the present invention has the advantages that all insulating films have a uniform film thickness, eliminates the problems of side etching when the contact windows or dopant windows are formed or of etching the element regions. It is possible to form element regions of the design size and a large margin of spacing for the isolating regions and the base region is unnecessary. A high degree of integration can be achieved.

8 Claims, 7 Drawing Sheets

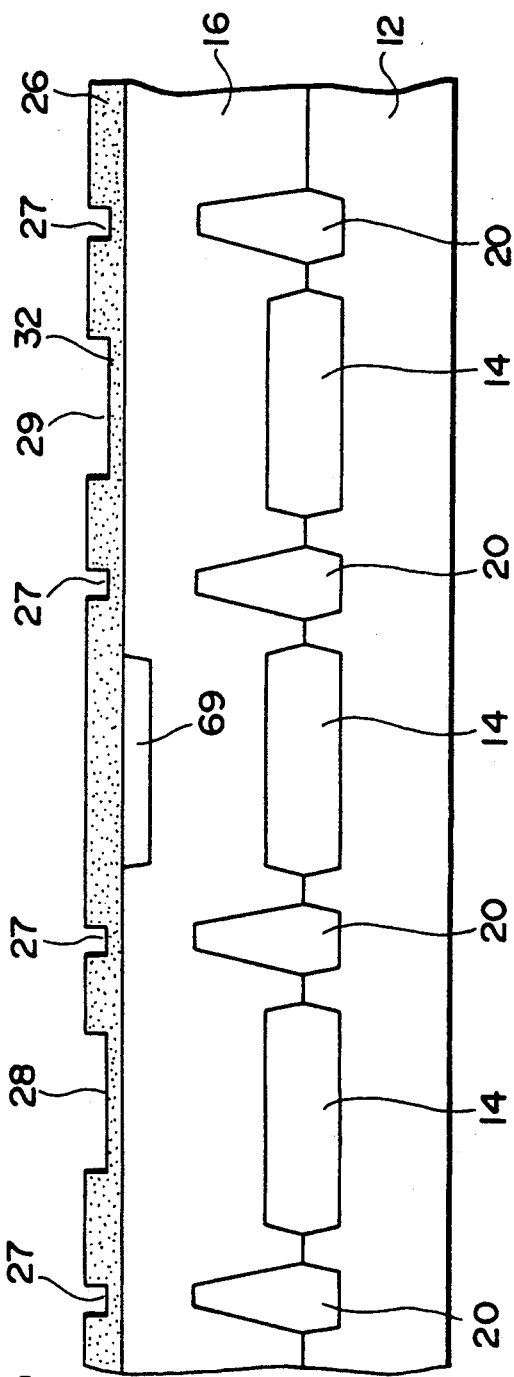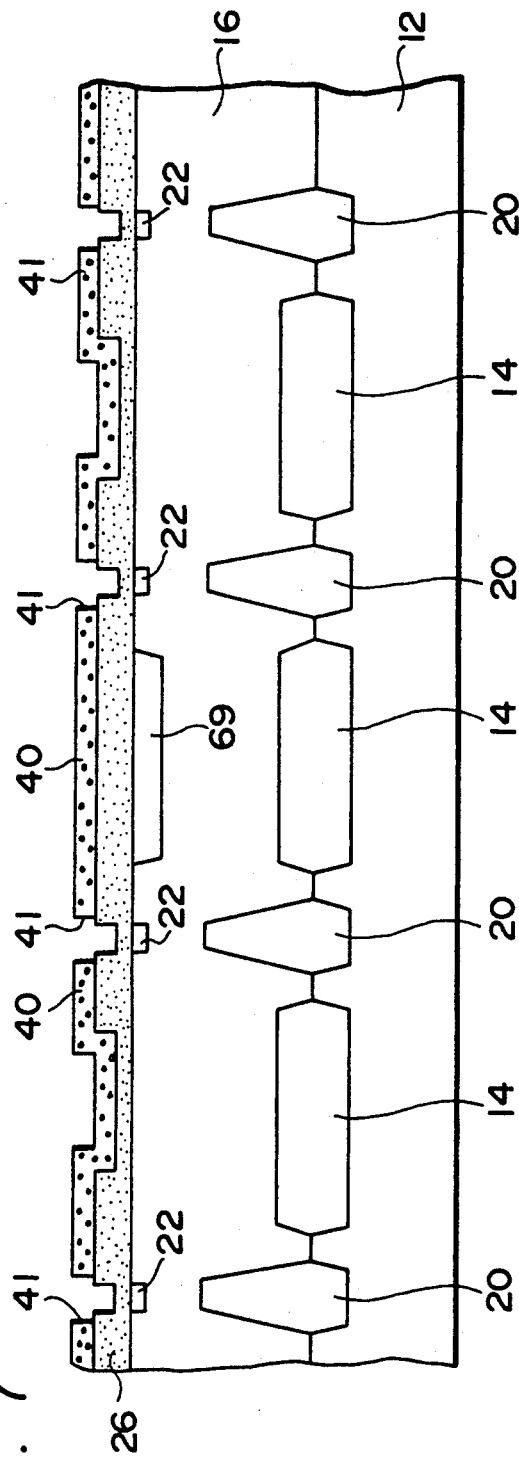

METHOD FOR MANUFACTURING A SEMICONDUCTOR INTEGRATED CIRCUIT INCLUDING A BIPOLAR TRANSISTOR

BACKGROUND OF THE INVENTION

1. Field of the Invention

The present invention relates to a method for manufacturing a semiconductor integrated circuit with a high degree of integration 2. Description of the Background Art A method of manufacturing a bipolar transistor on a semiconductor integrated circuit substrate was discussed in detail in the *Latest LSI Process Technology*, Apr. 25, 1984, published by Industrial Board of Inquiry.

FIG. 1 shows the configuration of the bipolar transistor disclosed in above literature. This bipolar transistor comprises: a collector region 94 which is an island formed in an N-type epitaxial layer 91 from a lower isolating region 92 and an upper isolating region 93; a P-type base region 95 formed within the island; and an $N^+$-type emitter region 96 formed within the base region 95. This type of bipolar transistor is manufactured by a process comprising steps of:

(i) forming a $SiO_2$ film on a P-type semiconductor substrate 90, forming a doping window for the buried layer 92 in the $SiO_2$ film, and selectively doping the P-type semiconductor substrate 90 with antimony through the doping window;

(ii) forming an $SiO_2$ film again on the P-type semiconductor substrate 90, forming a doping window for the buried layer 98 in this $SiO_2$ film, and selectively doping the semiconductor substrate 90 with boron through the doping window;

(iii) growing the epitaxial layer 91 on the surface of the semiconductor substrate 90, followed by forming an $SiO_2$ film on the surface of the epitaxial layer 91;

(iv) forming a doping window for the upper isolating region 93 in the $SiO_2$ film on the surface of the epitaxial layer 91 and selectively doping the epitaxial layer 91 with boron through the doping window;

(v) heat-treating the semiconductor substrate 90, and diffusing the various regions which were doped in the foregoing steps simultaneously, linking the lower isolating region 92 and the upper isolating region 93;

(vi) forming a doping window for the base region 95 in the $SiO_2$ film on the surface of the epitaxial layer 91, selectively doping the epitaxial layer 91 with boron through the doping window to form the base region 95;

(vii) forming doping windows for the emitter region 96 and for a collector contact region 97 in the $SiO_2$ film on the surface of the epitaxial layer 91, and doping the epitaxial layer 91 with phosphorous (P) through the doping windows to form the emitter region 96 and the collector contact region 97; and (viii) forming openings in respective portions of the $SiO_2$ film for the base region 95, the emitter region 96, and the collector contact region 97 to form each contact window, and applying aluminum to the surface of the semiconductor substrate 90 by evaporation to form respective aluminum electrodes which extend to the surface of the $SiO_2$ film from the base region 95, the emitter region 96, and the collector contact region 97.

As outlined above, in a method of manufacturing a semiconductor integrated circuit wherein the upper isolating region 93 and the lower isolating region 98 are diffused simultaneously from the upper and lower surfaces of the epitaxial layer 91 respectively to form the isolating regions, the area occupied by the upper isolating region 93 of the epitaxial layer 91 is small compared to that obtained by other methods of manufacturing a semiconductor integrated circuit wherein the isolating regions are formed by diffusion from the top surface of the epitaxial layer only, and a comparatively high degree of integration is achieved.

However, when designing the depth of diffusion of the upper isolating region 93, for example, 10 $\mu$m, the upper isolating region 93 also extends to the same extent in the lateral direction, so that the spacing between the upper isolating region and each region must be over 12 $\mu$m which is a sum of the diffusion distance (10 $\mu$m) of the upper isolating region 93 and a spacing margin (2 $\mu$m). For this reason, even with the above described method of manufacturing a semiconductor integrated circuit, the high degree of integration desired today in a semiconductor integrated circuit is not adequately obtained.

Because the upper isolating region 93, the base region 95, and the collector contact region 97 formed in the fourth, sixth, and seventh steps are selectively doped through different $SiO_2$ films, there is concern that the positions which these regions occupy will deviate from the design values, as shown by the dotted lines in FIG. 1, because of the mask alignment required to form the doping windows in each $SiO_2$ film or for the subsequent etching. For this reason, the spacing of these regions must be designed to provide a preset allowance so that contact between these regions resulting from the diffusion treatment is avoided. This is a hindrance to high integration. Also, in step 8 in which the respective contact windows in the $SiO_2$ films for the base region 95, the emitter region 96, and the collector contact region 97 are formed, the contact windows in the base region 95 and the emitter region 96 are completed prior to completely opening the window in the collector contact region 97 because the $SiO_2$ film for the base region 95 is comparatively thinner than the $SiO_2$ film for the collector contact region 97. The problem exists that side etching will proceed even further and these contact windows will be expanded beyond the design value. Therefore, it is difficult to design an extremely small base region, and this is a hindrance to high integration in a semiconductor integrated circuit. Also, depending on the etchant used at this time, when the base region 95 and the emitter region 96 are etched the production yield is poor.

SUMMARY OF THE INVENTION

Accordingly, a first object of the present invention is to provide a method for manufacturing a semiconductor integrated circuit wherein a base region can be formed with a size and position which meet the design specifications. Specifically, a margin of spacing for the isolating regions and the base region can be small, and, therefore, a semiconductor integrated circuit with a high degree of integration can be provided.

A second object of the present invention is to provide a method for manufacturing a semiconductor integrated circuit wherein an emitter region can be formed with a size and position which meet the design specifications. Specifically, it is possible to design an extremely small base region and emitter region, and therefore to provide a semiconductor integrated circuit with a high degree of integration.

A third object of the present invention is to provide a method of manufacturing a semiconductor integrated circuit wherein the formation of a plurality of doping windows or contact windows is completed simultaneously in the respective SiO$_2$ films. Specifically, when the doping windows or contact windows are formed, the element regions are not etched and a high manufacturing yield is obtained.

A fourth object of the present invention is to provide a method for manufacturing a semiconductor integrated circuit whereby a high degree of integration can be achieved, comprising a provision of a method for forming an upper isolating region wherein an adequate diffusion distance in the vertical direction is obtained by a relatively short heat treatment and the lateral diffusion effect is resultantly suppressed.

A fifth object of the present invention is to provide a method for manufacturing a semiconductor integrated circuit whereby a high degree of integration can be achieved, comprising a provision of a process for forming an isolating region wherein the diffusion distance of a lower isolating region and the diffusion distance of an upper isolating region can be designed independently whereby the exclusive area of the upper isolating region in a substrate surface can be restrained.

A sixth object of the present invention is to provide a method for manufacturing a semiconductor integrated circuit whereby a high degree of integration can be achieved, comprising a provision of a process for forming an isolating region wherein slippage of a mask for an upper isolating region can be tolerated, the upper isolating region and a lower isolating region are easily linked, and a complete isolation of junction is obtained.

A seventh object of the present invention is to provide a method for manufacturing a semiconductor integrated circuit whereby a high degree of integration can be achieved, wherein self-alignment of an upper isolating region and other regions for essential elements, such as a resistance element, a MOS capacitive element, or the like is assured.

An eighth object of the present invention is to provide a method for manufacturing a semiconductor integrated circuit, wherein the number of masking steps is reduced, eliminating the problems of the contamination of and damage to the semiconductor substrate.

These objects of the present invention are achieved by the method for manufacturing a semiconductor integrated circuit of this invention comprising steps of:

(i) forming a first insulating film on the surface of a semiconductor layer;

(ii) opening the areas in the first insulating film corresponding to an upper isolating region and a first-conductive-type integrated circuit element region of the same conductive type as the upper isolating region to form doping windows in these respective regions;

(iii) forming a first mask which shields the doping window of the first insulating film for the integrated circuit element region, and introducing a first-conductive-type dopant into the semiconductor substrate to form the upper isolating region;

(iv) introducing a dopant into the semiconductor substrate through all the doping windows in the first insulating film after the first mask is removed;

(v) diffusing the upper isolating region and the integrated circuit element region into which a dopant of the first-conductive-type has been introduced;

(vi) removing at least a part of the first insulating film to make the film thickness essentially uniform, followed by forming a second insulating film;

(vii) opening areas corresponding to each contact region of the integrated circuit element region and a second-conductive-type integrated circuit element region in the second insulating film to form the respective contact windows or doping windows, or the both;

(viii) forming a second mask in which the area is opened to correspond to the second-conductive-type integrated circuit element region in the second insulating film, and, then, introducing a dopant of the second-conductive-type into the semiconductor substrate, to form an integrated circuit element region of a second conductive type; and (ix) removing the second mask, and, then, forming an electrode which is in ohmic contact with the various contact regions of the integrated circuit element region.

The method of manufacturing the semiconductor integrated circuit of the present invention, wherein all the insulating films have a uniform film thickness, eliminates the problems of side etching when the contact windows or dopant windows are formed or of etching the element regions. For this reason, it is possible to form element regions of the design size and a large margin of spacing for the isolating regions and the base region is unnecessary. Therefore, a high degree of integration is achieved. Because the position and size of the emitter region can also be formed to meet the design value, the base region can be made very small and therefore an even higher degree of integration can be achieved.

In addition, the positions at which are formed the upper isolating region and the element regions of the same conductive type as the upper isolating region are readily determined. It is therefore possible to make the spacing margin for the upper isolating region and the other regions extremely small. Also, by means of this embodiment in which the number of masking steps is reduced, problems of contamination of and damage to the semiconductor substrate, and the like in the manufacturing stages are eliminated.

The present invention, wherein doping with a second-conductive-type of dopant is performed through the second insulating film and the second mask, has the advantage that some slippage between the masking patterns of the second insulating film and the second mask is tolerated. Specifically, the dopant which is inserted through the opening in the second mask finally reaches the surface of the semiconductor layer according to the second insulating layer mask pattern. The second mask therefore is adequate if it has the function of shielding the element regions which do not require doping. The element regions of second-conductive-type can be formed with high positional accuracy without precise mask alignment.

In the embodiment of this invention in which the dopant ions are implanted in the upper isolating region, the distribution of the dopant in the upper isolating region retrogrades directly after the ion implantation. It is therefore possible to reduce the width of the upper isolating region on the surface of the epitaxial layer, which reaches its maximum width in the subsequent diffusion step, and a semiconductor integrated circuit with a high degree of integration is achieved. In addition, because of the retrogradation of the distribution of the dopant in the upper isolating region, the upper and lower isolating regions are linked by means of a diffusion step at a low temperature over a comparatively short time. The width of the upper isolating region on the surface of the epitaxial layer can also be reduced, and, accordingly, a semiconductor integrated circuit with a high degree of integration is achieved.

Further, in another embodiment of the present invention wherein the upper and lower isolating regions are formed by different diffusion processes, it is possible to optionally design the respective diffusion conditions so as to deepen the diffusion of the lower isolating region and to shallow the diffusion of the upper isolating region. By this means, the lateral diffusion of the upper isolating region can be restrained, and it is possible to curtail the width of the exclusive surface area of the upper isolating region which affects the degree of integration of the semiconductor integrated circuit. Also, because the lower isolating region is designed with a large cross section which is formed by a longer period of diffusion than that used for the upper isolating region, a small amount of slippage of the mask can be tolerated during the formation of the upper isolating region, the upper isolating region and the lower isolating region are easily linked, and a complete isolation of junction is obtained.

Other objects, features and advantages of the invention will hereinafter become more readily apparent from the following description.

BRIEF DESCRIPTION OF THE DRAWINGS

FIG. 2 to FIG. 12 are sectional drawings illustrative of each step in the manufacture of a semiconductor integrated circuit substrate manufactured by the method of manufacturing a semiconductor integrated circuit of the present invention.

DETAILED DESCRIPTION OF THE INVENTION AND PREFERRED EMBODIMENTS

In order to easily understand the special masking steps of the present invention, first, the configuration of the cross section of a semiconductor integrated circuit 10 on which the masking steps have been completed will be explained with reference to FIG. 12.

Figure 12:
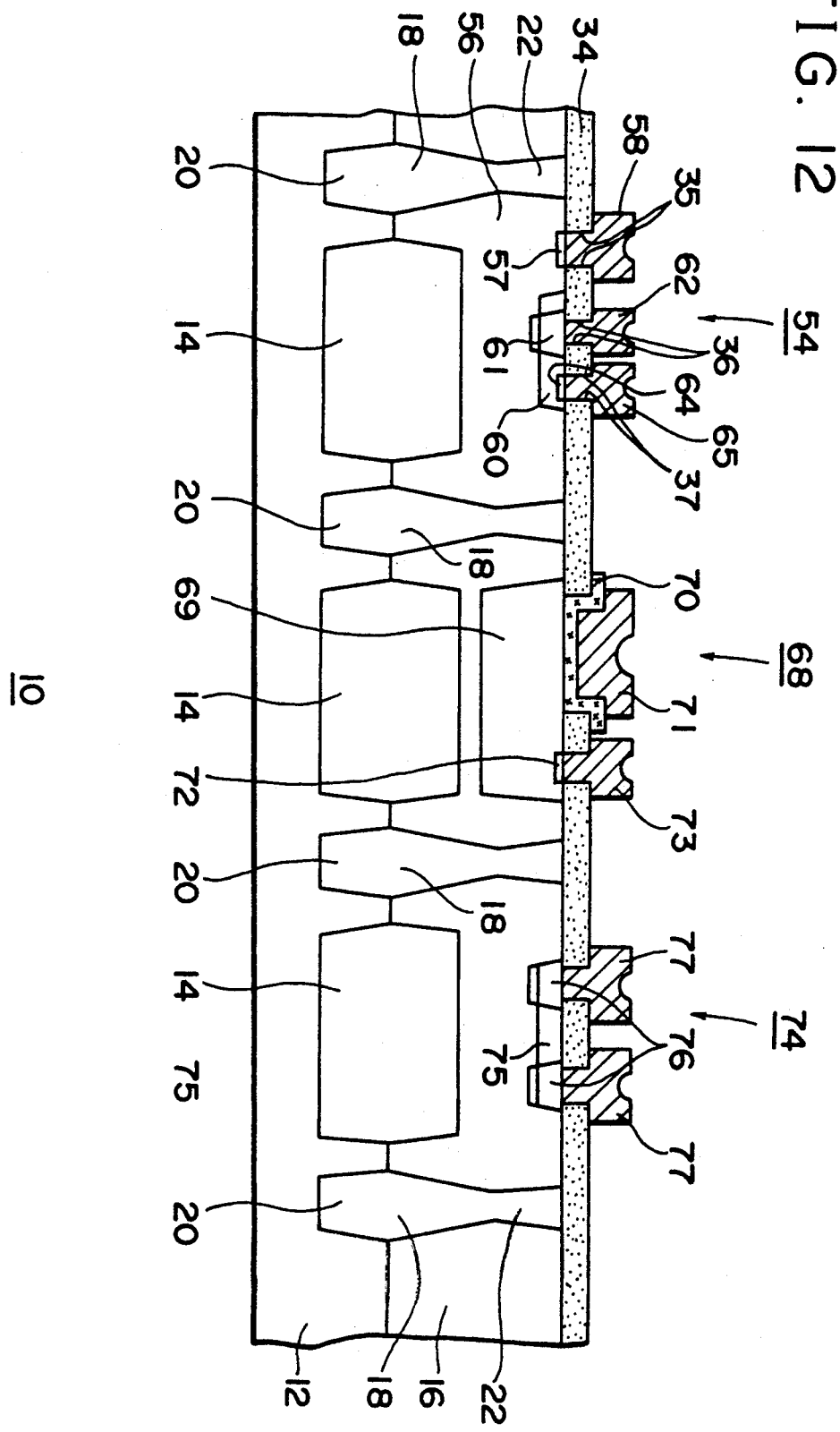

FIG. 12 shows a P-type semiconductor substrate 12; an N-type epitaxial layer 16 formed on the semiconductor substrate 12; a plurality of N+-type buried layers 14 formed by diffusion in the boundary region of the semiconductor substrate 12 and the N-type epitaxial layer 16; and a plurality of isolating regions 18, which reach the surface of the epitaxial layer 16 from the top of the semiconductor substrate 12 as well as the configuration of each type of integrated circuit element (later discussed) within the epitaxial layer 16.

The isolating regions 18 are obtained by diffusing upward a P-type lower isolating region 20 to a depth of a little more than half the thickness of the epitaxial layer 16 wherein the P-type lower isolating region 20 has been formed on the surface of the semiconductor substrate 12 prior to growing the epitaxial layer 16, and by diffusing downward a P-type upper isolating region 22 to reach the lower isolating region 20 from the surface of the epitaxial layer 16. As illustrated in the drawing, the isolating regions 18 are formed to enclose the buried layer 14, and a plurality of electrically isolated islands is formed by the isolating regions 18. In order to clarify the corresponding relationships, common reference numbers have been used in the drawings preceding and subsequent to the diffusion of the lower and upper isolating regions 20, 22.

A transistor 54, a MOS capacitive element 68, and a diffusion resistance element 74 are also shown in these drawings as examples of the integrated circuit elements. The transistor 54 is seen to comprise a collector region 56, which is the epitaxial region itself, a base region 60, and an emitter region 64 within a first island formed by the isolating region 18. Within another island, a MOS capacitive element 68 comprising a lower layer electrode region 69, a dielectric layer 70 formed on the upper layer of the lower layer electrode region 69, and an upper layer electrode 71 formed on the upper layer of the lower layer electrode region 69 is shown. Within still another island a diffused resistance region 74 is shown comprising a diffused resistance region 75 formed on the surface of the epitaxial layer 16 and two contact regions 76 at each end of the diffused resistance region 75.

The diffused regions of the transistor 54, the MOS capacitive element 68, and the diffused resistance region 74 have essentially the same thickness, and, accordingly, they are covered with an $SiO_2$ film 34 with essentially the same thickness, which is a special feature of the present invention.

The masking steps of the present invention will now be explained in sequence, with reference to FIG. 2 to FIG. 12.

Figure 1:
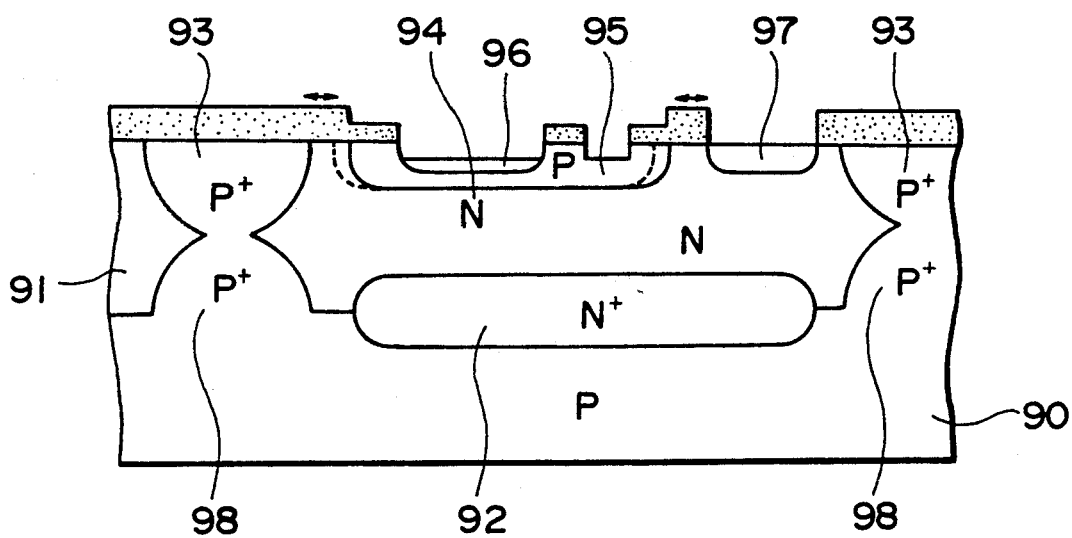
FIG. 1 is a sectional drawing of a semiconductor integrated circuit substrate manufactured by a conventional method.
Figure 2:
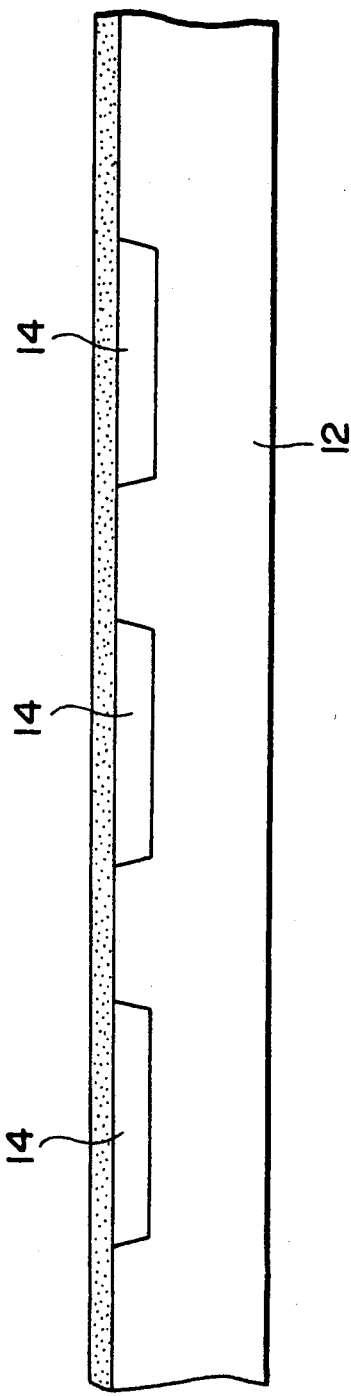
Figure 3:
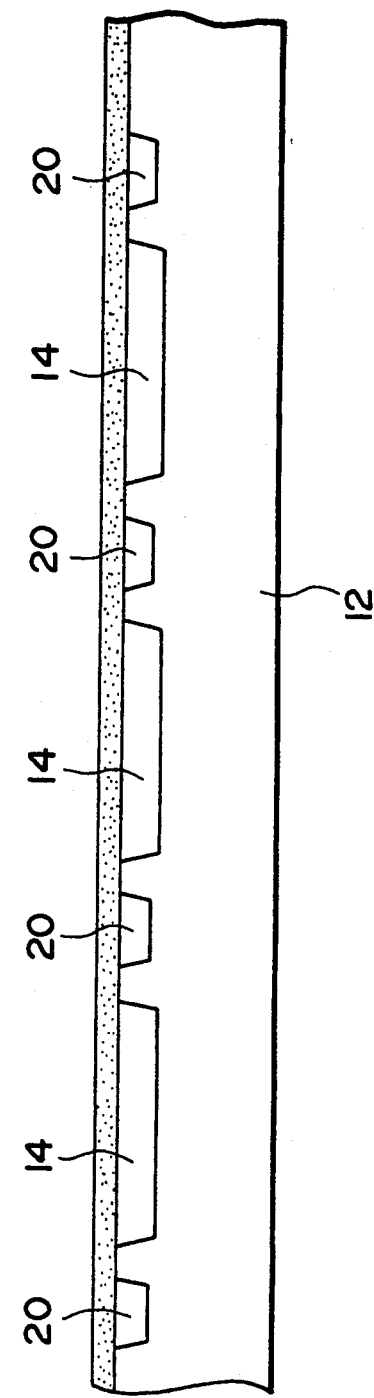

Now referring to FIG. 2, mainly, as a semiconductor substrate 12 which functions providing necessary strength in the manufacturing process, a P-type silicon semiconductor with impurity concentration of about $10^{15}$ atom/cm$^3$, and with a thickness of about 200 $\mu$m is used. An $SiO_2$ film is formed on the surface of the semiconductor substrate 12 by a commonly known thermal oxidation process, and a specified area of this $SiO_2$ film is opened by means of a commonly known photolithography (omitted from the drawings). Then the semiconductor substrate 12 is doped through the openings with antimony or arsenic, which are N-type dopants, to form the N+-type buried layers 14. FIG. 2 shows the cross sectional configuration of the semiconductor substrate 12 from which the $SiO_2$ film on the surface have been removed after the above process and on which again an $SiO_2$ film is newly formed. In the following explanation, it is proper that the layer which is subsequently subjected to a diffusion process is expressed as a buried layer. However, because this is very complicated, for the sake of simplicity the same representation and reference numbers are hereinafter used for the layer immediately after doping, and for the layer which is subsequently subjected to diffusion.

Next, an specified area of $SiO_2$ film which is newly formed is opened by photolithography in a different position from that of the previous $SiO_2$ film (omitted from the drawings). From this opening, boron, which is a P-type impurity, is introduced to dope the semiconductor substrate 12 to form a P+-type lower isolating region 20 (see FIG. 3). The lower isolating region 20 can also be doped with boron by the ion implantation method.

Figure 4:
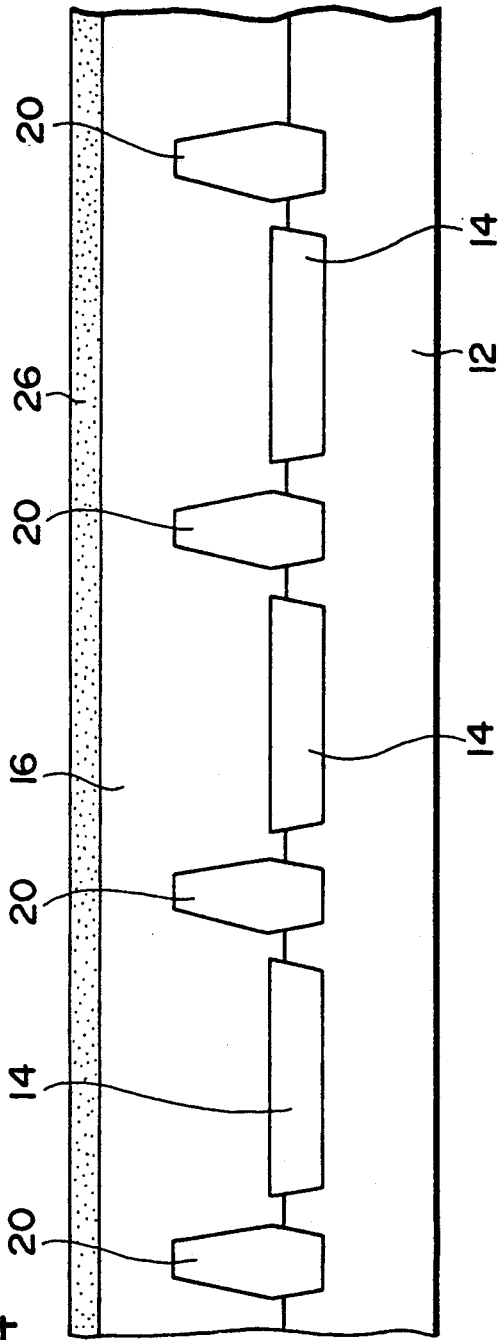
Figure 5:
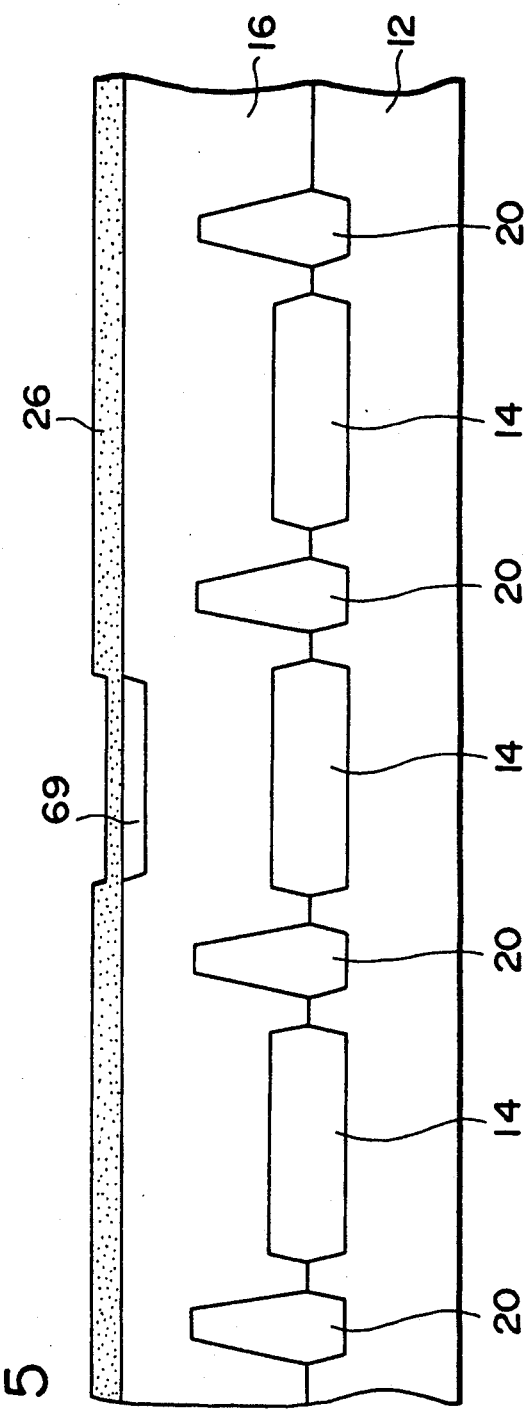

Now referring to FIG. 4, after the entire $SiO_2$ film has been removed from the semiconductor substrate 12 an N-type epitaxial layer 16 with a specific resistance of 0.1 to 5 $\Omega$.cm is grown to a thickness of about 7 $\mu$m on the semiconductor substrate 12 by a commonly known vapor phase deposition method. Hereinafter, for the sake of simplicity, the semiconductor substrate 12 combined with a region or layer formed by the subsequent step, for example, the epitaxial layer 16, is referred to as the semiconductor substrate 12. During the growth of the epitaxial layer 16, the semiconductor substrate 12 is exposed to high temperatures, and the dopant which has previously been introduced to dope the semiconductor substrate 12 is diffused to a certain extent at that time. Subsequently, the semiconductor substrate 12 is subjected to thermal oxidation for several hours at a temperature of about 1,000° C. to form an SiO$_2$ film 26 on the surface of the epitaxial layer 16, and maintained at about 1,000° C. for an additional 2 hours approximately. In this step the lower isolating region 20 is diffused upward to a depth of a little more than half the thickness of the epitaxial layer 16 (about 5 μm from the substrate surface). As will be later explained, the present invention is characterized by this step in which the lower isolating region 20 is diffused in the upward direction to a depth of a little more than half the thickness of the epitaxial layer 16.

At this time, because the lower isolating region 20 is also diffused to the same extent in the lateral direction (on the drawing), if the width of the doping window for the lower isolating region 20 is, for example, 4 μm, the lower isolating region 20 reaches a maximum width of about 14 μm in subsequent steps. Accordingly, it is effective for improving the circuit integration that the maximum thickness of the lower isolating region 20 is restrained by forming the epitaxial layer 16 as a thin layer.

Also, by this step the SiO$_2$ film 26 on the surface of the epitaxial layer 16 is further grown to a thickness of several thousand angstroms, and is used as a mask for subsequent selective diffusion. This mask may also be a silicon nitride film, or the SiO$_2$ film which may newly be formed by the CVD process.

Then, an opening is created in a portion of the SiO$_2$ film 26 for the lower layer electrode region 69 of the MOS capacitive element 68 and, for example, phosphorous glass (omitted from the drawing) is formed over the entire surface of the semiconductor substrate 12. Then, by a heat treatment at a specific temperature and for a specific time, phosphorous is diffused from the above-mentioned opening into the epitaxial layer 16 to form an N$^+$-type lower layer electrode region 69. The phosphorous glass is then removed with a specified etchant, and the heat treatment is again performed to diffuse the phosphorus to a specified depth (See FIG. 5).

Subsequently, each potion of the SiO$_2$ film 26 for the upper isolating region 22, the base region 60, and the diffused resistance region 75 (none of which are shown on the drawing) are opened by means of photolithography using a positive-type resist film and dry etching, to form the respective doping windows 27, 28, and 29. The SiO$_2$ film 26 is a special feature of the present invention, and, compared to other SiO$_2$ films of the present invention, in particular, to those used in the conventional manufacturing method, it is commonly used in subsequent steps for a longer time.

Following this, the exposed epitaxial layer 16 is oxidized and dummy oxidation film 32 is formed to reduce damage to the epitaxial layer 16 from the subsequent ion implantation steps and to implant the impurity ions uniformly. (See FIG. 6).

Next, as shown in FIG. 7, a resist film 40 which is capable of blocking ion implantation is formed on the SiO$_2$ film 26 of the previous step, an opening is made in the upper section only of the upper isolating region 22, and boron is introduced through a doping window 41 to form a P$^+$-type upper isolating region 22. The present invention in which ion implantation is carried out through the SiO$_2$ film 26 and the resist film 40 has the advantage that slippage of the mask patterns for the SiO$_2$ film 26 and the resist film 40 can be tolerated. Specifically, the ions implanted from the doping window 41 of the resist film 40 are finally implanted in the surface of the epitaxial layer 16 according to the mask pattern of the SiO$_2$ film 26. Therefore, the resist layer 40 is adequate if it has the function of shielding the doping windows 28, 29 of the base region 60 and the diffused resistance region 75 respectively. A precise mask alignment is unnecessary. Accordingly, it is desirable that the doping window 41 of the resist film 40 be formed slightly larger than the doping window 27 in the lower section of SiO$_2$ film 26, as in the resist film 40 shown in FIG. 7.

Figure 8:
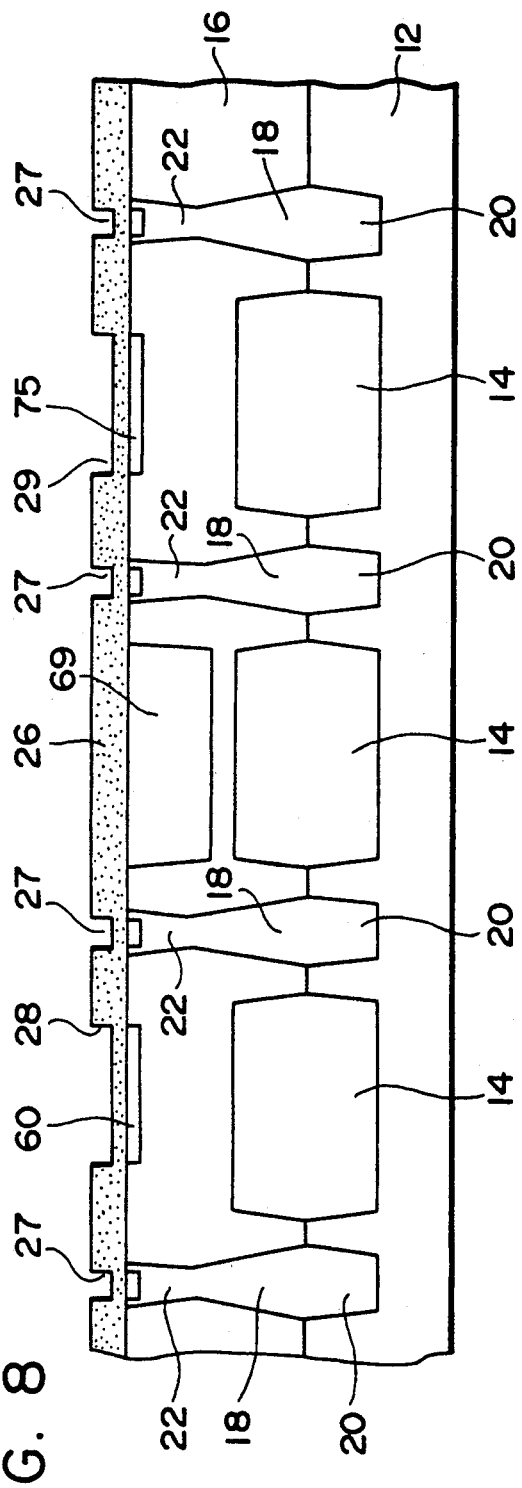
Figure 9:
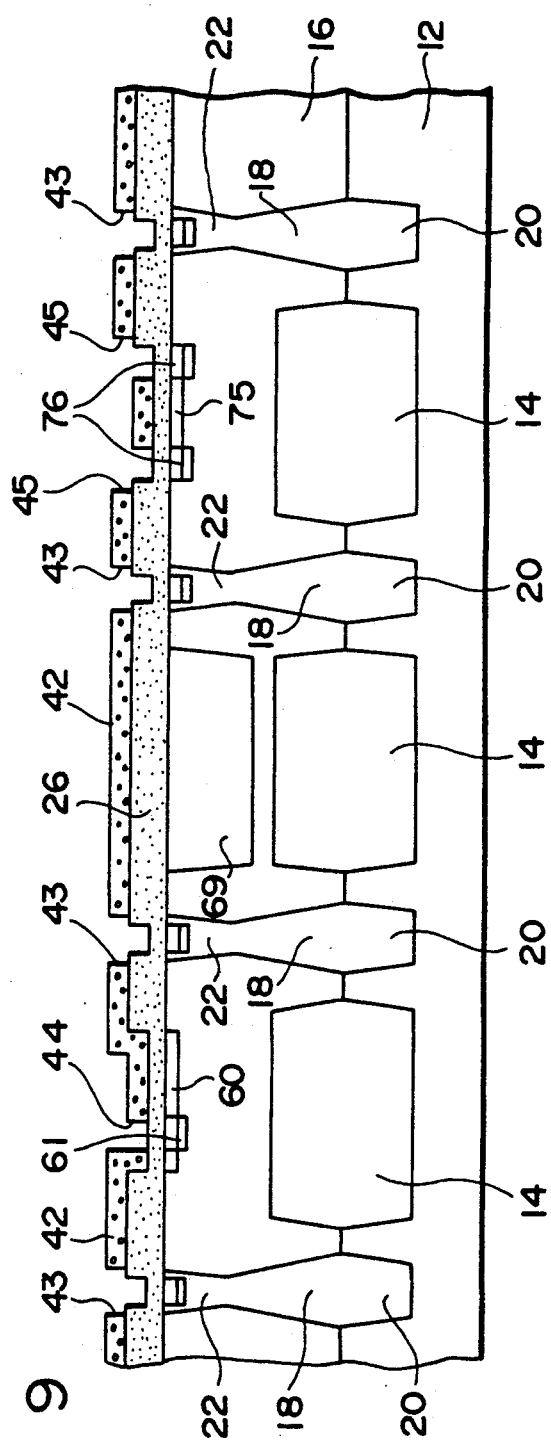

After the resist film 40 is removed, by subjecting the semiconductor substrate 12 to diffusion process under conditions such as, for example, about 1,200° C. for one hour, the upper isolating region 22 reaches the lower isolating region 20, and the both regions are linked to form the isolating region 18 as shown in FIG. 8.

In this step, subsequent ion implantation with boron is performed using only the SiO$_2$ film 26 as a mask to make a P-type base region 60 and a diffused resistance region 75.

In the present invention in which the isolating region 18, the base region 60, and the diffused resistance region 75 are formed in this way, retrogradation occurs in the dopant distribution in the upper isolating region 22 directly after ion implantation. The width of the upper isolating region 22 on the epitaxial layer 16 which is at its greatest width through the subsequent diffusion step can be narrowed. A high degree of integration is achieved in the semiconductor integrated circuit 10. In addition, because retrogradation occurs in the dopant distribution in the upper isolating region 22, the upper isolating region 22 and the lower isolating region 20 can be linked through a comparatively short-time, low-temperature diffusion step, whereby it is also possible to narrow the width of the upper isolating region 22 on the epitaxial layer 16, and, accordingly, to achieve a high degree of integration in the semiconductor integrated circuit 10.

Second, because the upper isolating region 22 and the lower isolating region 20 are formed in the respective diffusion processes, the diffusion conditions can optionally be designed so a to diffuse the lower isolating region 20 deeply and the upper isolating region 22 shallowly. The lateral diffusion of the upper isolating region 22 can be suppressed, and the width of the exclusive surface area of the upper isolating region 22 which directly affects the degree of integration of the semiconductor integrated circuit 10 can greatly be curtailed. Also, because the lower isolating region 20 which is formed by a longer period of diffusion than that used for the upper isolating region 22 is designed with a large cross section, a small amount of slippage of the mask can be tolerated during the period of formation of the upper isolating region 22. The upper isolating region 22 and the lower isolating region 20 are easily linked, and a complete isolation of junction is obtained.

Third, the positioning of the doping windows 27, 28, 29 is determined by a single mask, that is, the SiO$_2$ film 26. Because the positions where the upper isolating region 22 and either the base region 60 or the diffused resistance region 75 are formed are primarily determined, the spacing margin for the upper isolating region 22 and either the base region 60 or the diffused resistance region 75 ca.: be drastically reduced. The distance for lateral diffusion of the upper isolating region 22 is usually 0.8 times that for vertical diffusion, so that the respective intervals between the upper isolating region 22 and the regions for the various integrated circuit elements must be rationally designed at 0.8 times or greater the vertical diffusion distance of the upper isolating region 220

Also, in the present invention in which the number of masking steps is reduced, the problems of contamination of and damage to the semiconductor substrate during the manufacturing stages can be eliminated.

Following the steps related to FIG. 8, a new resist film 42 is formed on the SiO$_2$ film 26 and openings are formed by photolithography in respective areas corresponding to a base contact region 61, a diffused resistance element 74, and a pair of contact regions 76, to form the respective doping windows 43, 44, 45. Then, boron (B) ions are implanted in the epitaxial layer 16 through the resist film 42 and the SiO$_2$ film 26 to form a P-type base contact region 61 and two P-type contact regions 76. (See FIG. 9).

Figure 10:
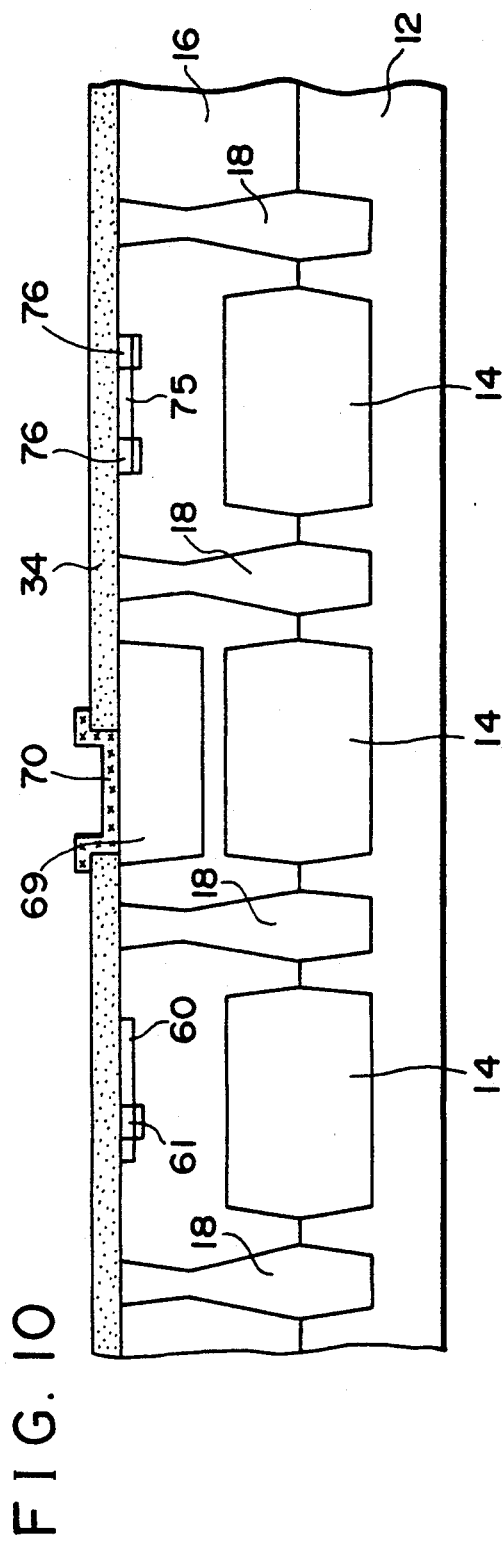

Now referring to FIG. 10, in this step, first, the SiO$_2$ film 26 on the surface of the epitaxial layer 16 is completely removed and a new SiO$_2$ film 34 is formed. The SiO$_2$ film 34 is formed as two layers—an non-doped SiO$_2$ film and a phosphorous (P) doped SiO$_2$ film (omitted from the drawing) so as to be capable of gettering Na ions. Alternatively, the SiO$_2$ film 34 may be formed by first etching the SiO$_2$ film 26 to substantially a uniform thickness of about 1,000 angstroms and by laminating a non-doped SiO$_2$ film and a phosphorous-doped SiO$_2$ film to a depth of about several thousand angstroms respectively on the SiO$_2$ film 26 etched. This SiO$_2$ film 34 with a uniform thickness of the present invention has a distinctive feature because of the reason that will be clarified by an explanation of the step related to FIG. 11.

Then, an opening is made in a portion of the SiO$_2$ film 34 for a dielectric layer 70 of a MOS capacitive element 68 by means of photolithography using a negative-type photoresist and wet etching. Then, a silicon nitride film of several hundred angstroms is formed on the surface of the semiconductor substrate 12 and etched by a chemical dry-etching method to form the dielectric layer 70 of the shape shown in FIG. 10.

Subsequently, the semiconductor substrate 12 is heat-treated under specified conditions, and the base region 60, the diffused resistance region 75, and their respective contact regions 61, 76 are subjected to diffusion. The resulting shapes of the base region 60, the diffused resistance diffusion 75, and their respective contact regions 61, 76, following the foregoing diffusion treatment, are shown in FIG. 11.

Figure 11:
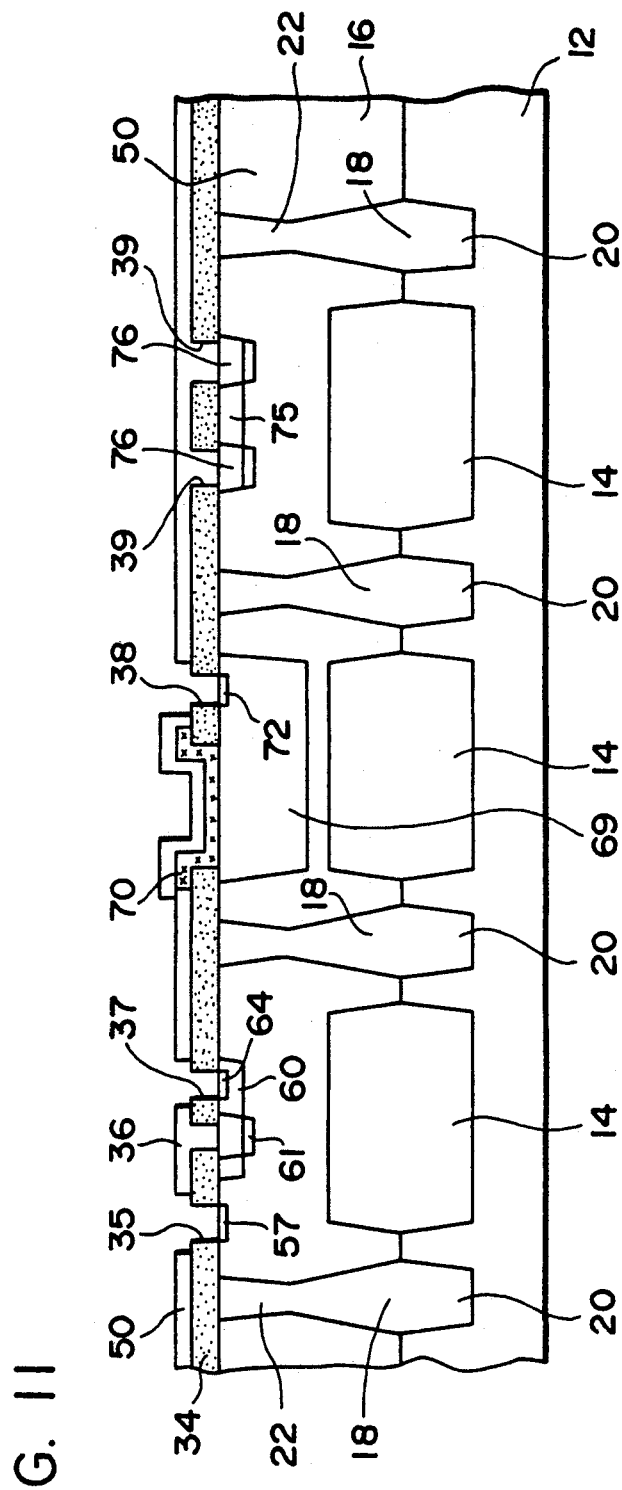

Referring to FIG. 11, in this step openings are formed by photolithography in the respective portions of the SiO$_2$ film 34 for a collector contact region 57, the base contact region 61, the emitter contact region 64, the contact region 72 of the lower layer electrode region 69, and the two contact regions 76 of the diffused resistance region 75, to form the doping windows and/or contact windows 35, 36, 37, 38, 39 simultaneously. Next, a photoresist film 50 is formed so as to expose the collector contact region 57, the emitter region 64, and the contact region 72 of the lower layer electrode region 69. Using the photoresist film 50 as a mask, arsenic (As) ions are then implanted in the epitaxial layer 16 to selectively form an N$^+$-type collector contact region 57, emitter region 64, and contact region 72 of the lower layer electrode region 69.

The most distinctive characteristic of the present invention is the SiO$_2$ film 34 of this step. Specifically, in a conventional semiconductor integrated circuit the film thicknesses of the doping windows and/or contact windows formed in the SiO$_2$ film differ according to the location, as shown by the reference number 26 in FIG. 9. For this reason, when the etching of the comparatively thick portion of the SiO$_2$ film for the collector contact region is completed, side etching proceeds in the comparatively thin portions of the SiO$_2$ film for the base contact region, the emitter region, and two contact regions 76 respectively. Also, there is concern that the emitter region itself will be etched, depending on the etching process used.

However, with the present invention, because the thickness of the entire SiO$_2$ film 34 is essentially uniform, the etching of a portion of the SiO$_2$ film 34 for the collector contact region 57, and the etching of the respective portions of the SiO$_2$ film 34 for the base contact region 61, the emitter region 64, and the two contact regions 76 of the diffused resistance region 75 are completed simultaneously. Therefore, the problem of side etching which causes the doping windows and/or the contact windows 36, 37, 39 to become larger than the design value is avoided.

Accordingly, by means of the present invention, first, the base region 60 can be made very small because the size of the emitter region 64 meets the design specifications. This gives the advantage of a high degree of integration.

Second, it is unnecessary to provide a large margin of spacing between the upper isolating region 22 and the other element regions such as the base contact region 61, the emitter region 64, and the two contact regions 76 of the diffused resistance region 75. This also gives the advantage of making a high degree of integration possible. There is also the advantage that lowering of the production yield from etching of the emitter region itself is prevented.

Further, because it is possible to use the SiO$_2$ film 34 as a mother mask in this step, in the same way that the SiO$_2$ film 26 was used in a previous step, slippage of the masking pattern of the photoresist film 50 can be tolerated, giving the advantage that it is unnecessary to provide a large margin of spacing between the upper isolating region 22 and the other element regions.

Now referring to FIG. 12, in this step, the semiconductor substrate 12 is heat-treated after the removal of the photoresist film 50 on the SiO$_2$ film 34, and downward diffusion of the emitter region 64 takes place. At this time, a slight SiO$_2$ film is newly formed at the doping windows, which is removed by light etching, and a plurality of aluminum electrodes 58, 62, 65 is formed at the collector contact region 57, the base contact region 61, and the emitter region 64, of the transistor 54 respectively; an aluminum electrode 73 at a contact region 72 of the lower layer electrode region 69 of the MOS capacitive element 68 and an aluminum electrode 71 as an upper layer electrode of the MOS capacitive element 68 are formed; and an aluminum electrode 77 is formed at the two contact regions 76 of the diffused resistance element 74.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a semiconductor integrated circuit comprising steps of:

forming a first insulating film on the surface of a semiconductor layer;

opening the respective portions of the first insulating film corresponding to an upper isolating region and a first-conductive-type integrated circuit element region of the same conductive type as the upper isolating region to form doping windows for these respective regions;

forming a first mask which shields the doping window of the integrated circuit element region of the first insulating film, and introducing a first-conductive-type dopant into the semiconductor layer to form the upper isolating region;

introducing a dopant into the semiconductor layer through the doping windows for at least the integrated circuit element region in the first insulating film after the first mask is removed;

removing at least one part of the first insulating film to make the film thickness essentially uniform followed by forming a second insulating film;

opening the respective portions of the second insulating film corresponding to each contact region of the integrated circuit element region and the integrated circuit element region of a second-conductive-type to form the respective contact windows and/or doping windows;

forming a second mask with an opening for the second-conductive-type integrated circuit element region on the second insulating film, and introducing a dopant of the second-conductive-type into the semiconductor layer to form an integrated circuit element region of a second conductive type; and removing the second mask, and forming an electrode which is in ohmic contact with the various contact regions of the integrated circuit element region.

2. The method of manufacturing a semiconductor integrated circuit of claim 1, wherein the second insulating layer is formed after the first insulating film is completely removed.

3. The method of manufacturing a semiconductor integrated circuit of claim 1, wherein the second insulating film comprises a non-doped silicon oxide film and a phosphorous (P) doped silicon oxide film.

4. The method of manufacturing a semiconductor integrated circuit of claim 1, wherein the integrated circuit element region of the first conductive type is a transistor base region; and the integrated circuit element region of the second conductive type is a collector contact region and an emitter region of a transistor.

5. The method of manufacturing a semiconductor integrated circuit of claim 1, wherein the integrated circuit element region of the first conductive type is a diffused resistance element region.

6. The method of manufacturing a semiconductor integrated circuit of claim 1, wherein the integrated circuit element region of the second conductive type is a lower layer electrode region of a MOS capacitive element.

7. The method of manufacturing a semiconductor integrated circuit of claim 1, wherein the semiconductor layer is formed by epitaxial growth, and the lower isolating region has been formed in advance by diffusing upward to a depth of a little more than half the thickness of the semiconductor layer.

8. The method of manufacturing a semiconductor integrated circuit of claim 1, wherein the upper isolating region is doped by ion implantation.

* * * * *